(12) United States Patent
Riaziat

(10) Patent No.: US 8,546,237 B2
(45) Date of Patent: Oct. 1, 2013

(54) TRANSFERRING AND RESIZING OF EPITAXIAL FILM ARRAYS AND METHOD THEREOF

(75) Inventor: Majid Riaziat, San Jose, CA (US)

(73) Assignee: Oepic Semiconductors, Inc., Sunnyvale, CA (US)

( * ) Notice: Subject to any disclaimer, the term of this patent is extended or adjusted under 35 U.S.C. 154(b) by 331 days.

(21) Appl. No.: 12/872,609

(22) Filed: Aug. 31, 2010

(65) Prior Publication Data

US 2012/0052663 A1    Mar. 1, 2012

(51) Int. Cl.
*H01L 21/76* (2006.01)

(52) U.S. Cl.
USPC ........... 438/406; 438/411; 438/413; 438/458; 257/623

(58) Field of Classification Search
None
See application file for complete search history.

(56) References Cited

U.S. PATENT DOCUMENTS

| | | | | |
|---|---|---|---|---|
| 5,827,751 | A * | 10/1998 | Nuyen | 438/28 |
| 7,244,662 | B2 * | 7/2007 | Kondo | 438/458 |
| 2003/0157783 | A1 * | 8/2003 | Fonash et al. | 438/458 |
| 2004/0134416 | A1 * | 7/2004 | Furuyama | 117/84 |
| 2005/0202595 | A1 * | 9/2005 | Yonehara et al. | 438/110 |
| 2005/0215054 | A1 * | 9/2005 | Rasmussen et al. | 438/667 |

* cited by examiner

*Primary Examiner* — Evan Pert
*Assistant Examiner* — Andres Munoz
(74) *Attorney, Agent, or Firm* — Weiss & Moy, P.C.; Jeffrey D. Moy

(57) ABSTRACT

A method of transferring an epitaxial film from an original substrate to a destination substrate comprises: growing an epitaxial film grown with a sacrificial layer on the original substrate; patterning the epitaxial film into a plurality of sections; attaching the plurality of sections to a stretchable film; removing the plurality of sections attached to the stretchable film from the original substrate; stretching the sections apart as needed; and attaching a permanent substrate to the plurality of sections; and trimming the sizes of the sections as needed for precise positioning prior to integrated circuit device fabrication.

17 Claims, 2 Drawing Sheets

TRANSFERRING AND RESIZING OF EPITAXIAL FILM ARRAYS AND METHOD THEREOF

FIELD OF THE INVENTION

The present invention relates to semiconductor devices, and more specifically, to a system and method for transfer epitaxially grown thin film material from its original substrate to a destination substrate in the form of an array of islands with selectable spacing and periodicity.

BACKGROUND OF THE INVENTION

Current state-of-the-art semiconductor device processing trends are increasingly moving towards thin film devices, flexible electronics, and sophisticated three-dimensional integration schemes, and the like. All of the aforementioned generally require device layers to be transferred from a growth substrate of one desired property (e.g., a desired lattice parameter) to an alternate substrate with other desired qualities (e.g., for integration with other devices).

Transfer of a device layer from a growth substrate to another substrate may be accomplished by several different methods such as, but not limited to: a lapping and etching process, separation by ion implantation, a laser lift-off method, and a selective etching process. All of the above have limitations which will be described below.

Semiconductor film transfer may be done by a lapping and etching process. With GaAs and InP based materials, the substrate is often removed by lapping and chemical etching after the original wafer is mounted face down on the new substrate. The waste products of this process may be recycled; however significant energy and cost go into the recycling process.

Separation by implantation is used in the Silicon on Insulator (SOI) process, whereby a thin layer of silicon is transferred to an insulating substrate for further processing. This technique has not been applied to other semiconductors or to epitaxial layers that may be damaged by ion implantation.

Laser Lift-off (LLO) has been used successfully by the GaN LED industry for separating the processed devices or the epitaxial film from the sapphire substrate that was used for the epitaxial growth. Laser lift-off may be used with GaN family of materials grown on a sapphire substrate. The substrate may be reused after laser lift-off. The typical process involves irradiating the wafer with short ultraviolet laser pulses through the transparent sapphire substrate. The interfacial GaN layer absorbs the radiation and generates localized heat that facilitates the release of the substrate. This approach, however, is not applicable to III-V substrates (on which most lasers, optoelectronic devices, and many high-speed electronic devices are grown). The reason is that the substrates are opaque to visible and UV radiation. Also no interfacial layer exists that can absorb the radiation transmittable through the substrate while preventing any heat induced damage to the active epitaxial layers.

Film transfer to flexible substrates has been demonstrated by wet chemical etching of a sacrificial layer. This process relies on selective etching of a thin sacrificial layer grown below the epitaxial film. AlAs, and AlGaAs with a high aluminum content, are convenient sacrificial layers that can be used on GaAs substrates. The film and the flexible substrate are "peeled off" of the original substrate as the sacrificial layer dissolves in the etchant. High selectivity is achieved by a dilute HF etch of these materials. The etchant does not attack the GaAs substrate. Similar sacrificial layers and etch chemistries are also available for InP. However, the epitaxial film develops microcracks when transferred to a flexible substrate, and the subsequent processing is difficult on a non-rigid surface.

Thus, a need existed to provide a system and method to overcome the above problems.

SUMMARY OF THE INVENTION

In accordance with one embodiment, a method of transferring an epitaxial film from an original substrate to a destination substrate is disclosed. The method comprises: growing an epitaxial film over a sacrificial layer on the original substrate; patterning the epitaxial film into a plurality of sections; attaching the plurality of sections to a stretchable film; removing the plurality of sections attached to the stretchable film from the original substrate; and attaching a permanent substrate to the plurality of sections.

In accordance with another embodiment, a method of transferring an epitaxial film from an original substrate to a destination substrate is disclosed. The method comprises: growing an epitaxial film grown with a sacrificial layer on the original substrate; patterning the epitaxial film into a plurality of sections; attaching the plurality of sections to a stretchable film; and attaching a permanent substrate to the plurality of sections.

A method of transferring an epitaxial film from an original substrate to a destination substrate comprises: growing an epitaxial film grown with a sacrificial layer on the original substrate; patterning the epitaxial film into a plurality of sections; attaching the plurality of sections to a stretchable film; removing the plurality of sections attached to the stretchable film from the original substrate; stretching the stretchable file to a size of a permanent substrate; attaching the plurality of sections to a temporary substrate prior; removing the stretchable tape; and attaching a permanent substrate to the plurality of sections.

The foregoing and other objectives, features, and advantages of the invention will be apparent from the following and more particular, descriptions of the preferred embodiments of the invention, as illustrated in the accompanying drawings.

BRIEF DESCRIPTION OF THE DRAWINGS

Common reference numerals are used throughout the drawings and detailed description to indicate like elements.

DETAILED DESCRIPTION

The present invention relates to the transfer of epitaxially grown thin film material from its original substrate to a destination substrate in the form of an array of islands with selectable spacing and periodicity. In accordance with one embodiment, this method will make it possible for compound semiconductor devices to be processed together with silicon devices on a full size silicon wafer. The method may further allow the compound semiconductor substrate to be reused for epitaxial growth.

Referring now to FIGS. 1A-2D, a method to the transfer of epitaxially grown thin film material from its original substrate to a destination substrate will be disclosed. The method is a multi-step process wherein a patterned epitaxial film is lifted off of a base substrate, the patterned epitaxial film is then placed on a temporary substrate, a permanent substrate is then attached to the patterned epitaxial film, and the temporary substrate is then removed.

Figure 1A:
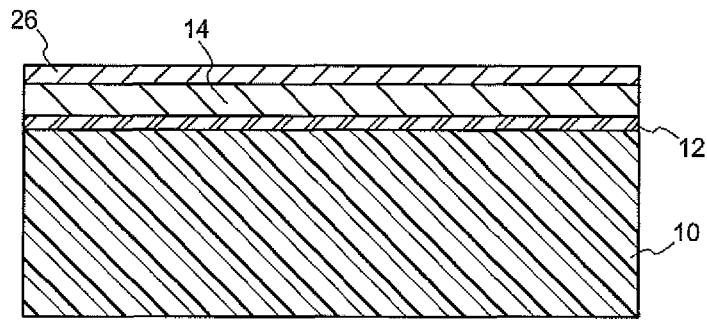
FIG. 1A depicts a step involved in substrate lift-off wherein epitaxial film grown with a sacrificial layer.
Figure 1B:
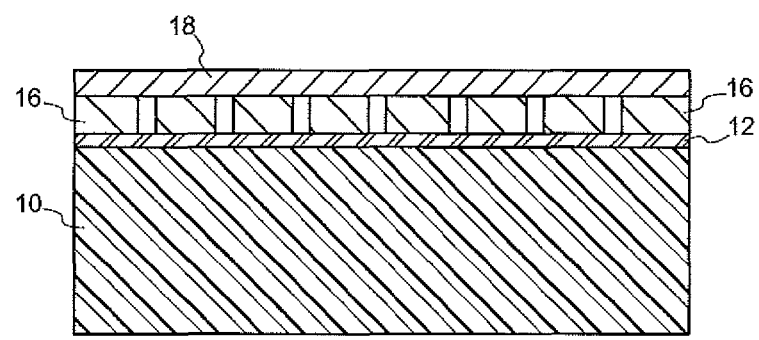
FIG. 1B depicts a step involved in substrate lift-off wherein the epitaxial film is patterned into sections islands and attached to a stretchable film.
Figure 1C:
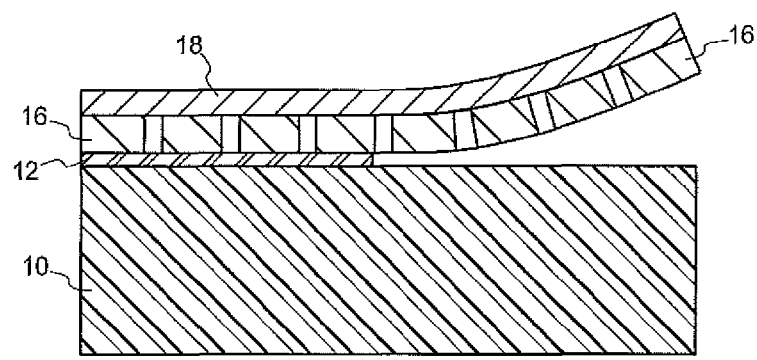
FIG. 1C depicts a step involved in substrate lift-off wherein the sacrificial layer is etched away and the islands are "peeled off" attached to the stretchable film.

Referring now to FIGS. 1A-1C, a base substrate 10 is provided. The base substrate 10 may include any device or structure that may be formed when making a semiconductor device. The base substrate 10 may be formed of silicon, germanium, silicon germanium, or other suitable semiconductor material. The listing of the above is given as an example and should not be seen in a limiting manner.

A sacrificial layer 12 is grown on a first surface 10A of the base substrate 10. The sacrificial layer 12 may be comprised of a conductive metallic material, a polymer material or a combination of both a conductive metallic material and a polymer material. Examples of possible sacrificial layer materials include, but are not limited to, aluminum, copper, steel, iron, bronze, brass, polyimide, polyetherimide, fluoropolymer and alloys and combinations thereof.

Next, the epitaxial film 14 is grown on a top surface of the sacrificial layer 12. As shown more clearly in FIG. 1B, the epitaxial film 14 is patterned. In the embodiment shown in FIG. 1B, the epitaxial film 14 is pattern and etched into a plurality of small sections 16. Each section 16 is formed in the size of a desired compound semiconductor device to be fabricated.

A stretchable material 18 is then attached to a surface of each section 16. The surface is generally the surface opposite of the surface of the epitaxial film 14 that is attached to the sacrificial layer 12. The stretchable material 18 may be a stretchable tape or the like having an adhesive surface that attaches to each section 16. The stretchable tape may be a variation of the products known in the industry as "dicing tape". One example is Advantek DU099H™ tape which has a Polyolefin base and a UV release adhesive.

The sections 16 of the patterned epitaxial film 14 are attached to the stretchable material 18 in order to transfer the sections 16. The stretchable material 18 allows the sections 16 to be removed from the base substrate 10.

Referring now to FIG. 1C, as the sacrificial layer 12 is etched away, the stretchable material 18 allows the sections 16 to be "peeled off" of the base substrate 10, wherein the sections 16 remain attached to the stretchable material 18. An etchant fluid may be used to dissolves the sacrificial layer 12 from the base substrate 10. Thus, stretchable material 18 and its adhesive need to be resistant to the wet etch chemistry used to remove the sacrificial layer 12.

Figure 2A:
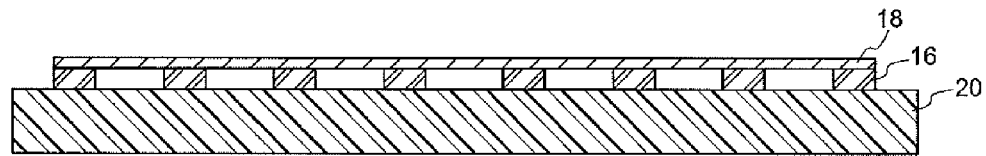
FIG. 2A depicts a step for transferring the patterned epitaxial film wherein the tape is stretched to the size of the final substrate.

Referring now to FIG. 2A, once the sections 16 are released from the base substrate 10, the stretchable material 18 is expanded. The stretchable material 18 is expanded to the size of a silicon or other semiconductor wafer on which the array of sections 16 is to be deposited.

The "dicing tape" disclosed above is capable of stretching to multiple times its original size. A linear stretchability or elongation of up to 4× is desirable. This will expand the array of sections 16 by a factor of 16. So the devices built on the epitaxial film 14 will constitute ~6% of the total area of the integrated circuit. For example, a 3" GaAs wafer can supply the islands for a 12" silicon wafer, and the GaAs substrate can be reused for epitaxial growth.

Even if the expansion of the stretchable material 18 is not desired, the etching of the epitaxial film 14 into a plurality of sections 18 is beneficial in reducing the micro-cracks that may develop during the separation from the base substrate 10.

The expansion of the stretchable material 18 may create cracks in the epitaxial film 14. In order to reduce this possibility, several steps may be taken to minimize this risk. For example, additional epitaxial material may be grown to give provide more rigidity to the epitaxial film 14. Also, a protective layer 26 may be deposited on top of the epitaxial film 14. The protective layer 26 may be a protective metal layer deposited on top of the epitaxial film 14. Alternatively, the protective layer 26 may be a flexible protective layer such as a polymer deposited on top of the epitaxial film 14. This will reduce the stress on the epitaxial film 14 during the expansion of the stretchable material 12. Another step that may be taken to minimize this risk is to perform the expansion in multiple smaller steps by transferring the sections 16 of the epitaxial film 14 from one tape to another between each expansion. Another possibility is to remove the base substrate 10 only after the array of sections 16 has been stretched. This will not allow the original substrate to be reused for epitaxial growth, since it needs to be diced.

After the optional expansion of the stretchable material 18, the sections 16 are attached to a temporary rigid substrate 20. This may be accomplished by applying an adhesive 22 to the temporary rigid substrate 20. The adhesive 22 may be an epoxy or other temporary adhesion method.

The reason for the temporary rigid substrate 20 is that typically permanent attachment or the fusion of the sections 16 to the final substrate 24 requires the application of heat and pressure which may not be suitable for the stretchable material 18. However, if high-temperature attachment is not needed for the final application, or if the stretchable material 18 that is destroyed in high-temperature attachment can be removed by cleaning, the use of the temporary rigid substrate 20 may not be needed.

Figure 2B:
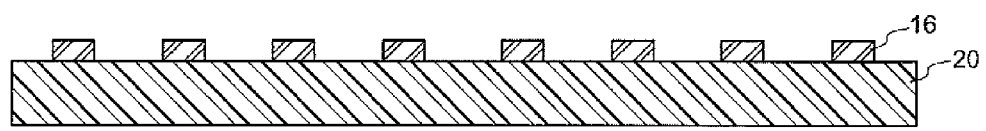
FIG. 2B depicts a step for transferring the patterned epitaxial film wherein the separated islands are attached to a temporary rigid substrate and the stretchable tape is removed.

Referring now to FIG. 2B, the stretchable material 18 is then removed. In accordance with one embodiment, the removable of the stretchable material 18 may be accomplished by UV releasing of the adhesive of the stretchable material. However, it should be noted that other methods may be used without departing from the spirit and scope of the present invention.

Figure 2C:
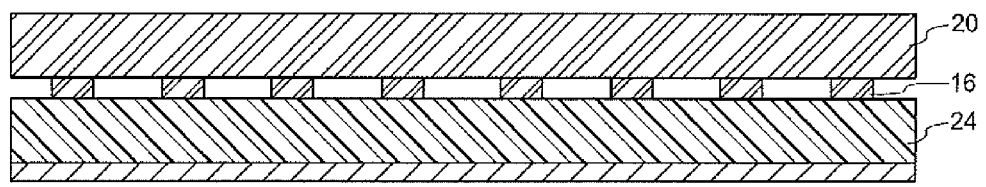
FIG. 2C depicts a step for transferring the patterned epitaxial film wherein the islands are fused or permanently attached to the final substrate.

Referring to FIG. 2C, the next step is to perform attach the sections 16 to, a final substrate 24. In accordance with one embodiment, the sections 16 may be fused or permanently attached to the final substrate 24.

The attachment of the epitaxial islands to the final substrate may be done by a number of different techniques depending on its end use requirements. These techniques fall into two general categories: direct bonding, and bonding with intermediate layers.

Direct bonding between silicon and III-V materials may be done by applying pressure at temperatures in the range of 400 to 650° C. Better interface quality may be achieved by lower temperature bonding using e.g. plasma assisted bonding.

Bonding with intermediate layers may be categorized into: conducting interface and non-conductive interface. Conductive interface formation normally involves the metallization of one or both surfaces and the use of various eutectics or solders. Attachment with a nonconductive interface involves an intermediate layer such as glass, or various polymers.

Commercial equipment is available with programmable pressure and temperature cycles to achieve optimal and reproducible bonding.

Figure 2D:
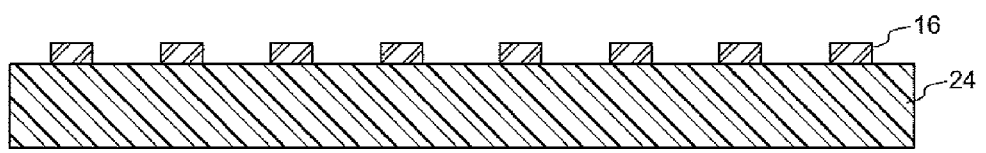
FIG. 2D depicts a step for transferring the patterned epitaxial film wherein the temporary substrate is removed, precise positioning of the islands is achieved by transferring oversized sections and trimming them by etching to a smaller size using lithography. This will form compound semiconductor mesas precisely positioned for further processing on the new substrate.

Next, as shown in FIG. 2D, the temporary rigid substrate 20 is removed. The sections 16 may then be trimmed by lithography prior to the full processing of the new wafer. The trimming enhances the placement accuracy of the epitaxial sections 16 and forms the mesa structures on which the compound semiconductor devices are fabricated.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of transferring an epitaxial film from an original substrate to a permanent substrate comprising:
   growing the epitaxial film grown with a sacrificial layer on the original substrate;
   patterning the epitaxial film into a plurality of sections;
   attaching the plurality of sections to a stretchable film;
   removing the plurality of sections attached to the stretchable film from the original substrate;
   stretching the stretchable film to a size of the permanent substrate on which the plurality of sections is to be attached;
   attaching the plurality of sections to a temporary substrate; and
   attaching the permanent substrate to the plurality of sections.

2. The method of claim 1 further comprising removing the stretchable film.

3. The method of claim 1 further comprising etching away the sacrificial layer.

4. The method of claim 1 wherein growing the epitaxial film further comprises growing epitaxial material to provide rigidity to the epitaxial film.

5. The method of claim 1 further comprising depositing a protective layer on the epitaxial film.

6. The method of claim 5 wherein the protective layer is a protective metal layer.

7. The method of claim 5 wherein the protective layer is a flexible protective layer.

8. The method of claim 7 wherein the flexible protective layer is a polymer.

9. A method of transferring an epitaxial film from an original substrate to a permanent substrate comprising:
   growing the epitaxial film grown with a sacrificial layer on the original substrate;
   patterning the epitaxial film into a plurality of sections;
   attaching the plurality of sections to a stretchable film;
   stretching the stretchable film to a size of the permanent substrate on which the plurality of sections is to be attached;
   attaching the plurality of sections to a temporary substrate;
   removing the stretchable film; and
   attaching the permanent substrate to the plurality of sections.

10. The method of claim 9 further comprising removing the plurality of sections attached to the stretchable film from the original substrate prior to attaching the permanent substrate to the plurality of sections.

11. The method of claim 10 further comprising etching away the sacrificial layer.

12. The method of claim 10 wherein growing the epitaxial film further comprises growing epitaxial material to provide rigidity to the epitaxial film.

13. The method of claim 10 further comprising depositing a protective layer on the epitaxial film.

14. The method of claim 9 further comprising stretching the stretchable film to the size of the permanent substrate prior to attaching the plurality of sections to the temporary substrate.

15. A method of transferring an epitaxial film from an original substrate to a permanent substrate comprising:
   growing the epitaxial film grown with a sacrificial layer on the original substrate;
   patterning the epitaxial film into a plurality of sections;
   attaching the plurality of sections to a stretchable film;
   removing the plurality of sections attached to the stretchable film from the original substrate;
   stretching the stretchable film to a size of the permanent substrate;
   attaching the plurality of sections to a temporary substrate;
   removing the stretchable film; and
   attaching the permanent substrate to the plurality of sections.

16. The method of claim 15 wherein growing the epitaxial film further comprises growing epitaxial material to provide rigidity to the epitaxial film.

17. The method of claim 15 further comprising depositing a protective layer on the epitaxial film.

* * * * *